United States Patent
Jones

(10) Patent No.: US 9,449,714 B2
(45) Date of Patent: Sep. 20, 2016

(54) FLEXIBLE INTERRUPT GENERATION MECHANISM

(71) Applicant: Advantest Corporation, Tokyo (JP)

(72) Inventor: Michael Jones, San Carlos, CA (US)

(73) Assignee: ADVANTEST CORPORATION, Tokyo (JP)

( * ) Notice: Subject to any disclaimer, the term of this patent is extended or adjusted under 35 U.S.C. 154(b) by 516 days.

(21) Appl. No.: 13/967,169

(22) Filed: Aug. 14, 2013

(65) Prior Publication Data

US 2015/0052409 A1 Feb. 19, 2015

(51) Int. Cl.
| | |
|---|---|
| *G11C 29/08* | (2006.01) |
| *G06F 11/22* | (2006.01) |
| *G11C 29/56* | (2006.01) |

(52) U.S. Cl.
CPC ........... *G11C 29/08* (2013.01); *G06F 11/2231* (2013.01); *G11C 29/56* (2013.01)

(58) Field of Classification Search
CPC .... G11C 29/08; G11C 29/56; G06F 11/2231
USPC ................................................. 710/260–269
See application file for complete search history.

(56) References Cited

U.S. PATENT DOCUMENTS

| | | | | |
|---|---|---|---|---|
| 6,006,301 | A * | 12/1999 | Tetrick | G06F 13/24 710/260 |
| 2005/0125583 | A1* | 6/2005 | Shih | G06F 13/423 710/260 |
| 2005/0228923 | A1* | 10/2005 | Zimmer | G06F 9/4812 710/269 |
| 2009/0006793 | A1* | 1/2009 | Yamada | G06F 11/1658 711/162 |

FOREIGN PATENT DOCUMENTS

| | | | | |
|---|---|---|---|---|
| EP | 2009551 A1 * | 12/2008 | | G06F 11/2028 |
| GB | 2144228 A * | 2/1985 | | G01R 31/31935 |

OTHER PUBLICATIONS

Frenzel, Louis E.; Fast Pin Electronics Meet Ate Challenges; electronicdesign.com/print/boards/fast-pin-electronics-meet-ate-challenges; Jan. 29, 2008; 2 pages.
GLossary Definition for Pin Electronics Glossary Term: Pin Electronics; www.maximintegrated.com/en/glossary/definitions.mvp/term; 2015; 1 page.

* cited by examiner

*Primary Examiner* — Glenn A Auve

(57) ABSTRACT

In a testing device, a method for implementing efficient interrupt routing. The method includes receiving an interrupt from a plurality of interrupt causes, consulting an interrupt routing table to determine an output interrupt vector, and forwarding the output interrupt vector to one or more of a plurality of different CPUs in accordance with the interrupt routing table.

20 Claims, 5 Drawing Sheets

"CRM1" = 1 half-bridge, sharing a CPU
"CRM2" = 2 half-bridges (1 bridge) with own CPU
"CRM3" = 3 half-bridges with a master CPU and a shared slave CPU
"CRM4" = 4 half-bridges (2 bridges) with a master CPU and a slave CPU
"CRM6" = 6 half-bridges (3 bridges) with a master CPU and two slave CPUs
"CRM12" = 12 half-bridges (6 bridges on 2 PEMs) with a master CPU and five slave CPUs "CRM1" = 1 half-bridge, sharing a CPU
"CRM2" = 2 half-bridges (1 bridge) with own CPU
"CRM3" = 3 half-bridges with a master CPU and a shared slave CPU
"CRM4" = 4 half-bridges (2 bridges) with a master CPU and a slave CPU
"CRM6" = 6 half-bridges (3 bridges) with a master CPU and two slave CPUs
"CRM12" = 12 half-bridges (6 bridges on 2 PEMs) with a master CPU and five slave CPUs

FLEXIBLE INTERRUPT GENERATION MECHANISM

FIELD OF THE INVENTION

The present invention is generally related to computer system test equipment

BACKGROUND OF THE INVENTION

With the increasing popularity of smartphones, multifunctional portable devices, and SSDs, demand for NAND flash memory has skyrocketed. The global NAND market is set to grow 18% in 2011. Moreover, NAND flash device capacity and speed is also increasing. Average data transmission speeds have climbed ten-fold to 400 Mbps. These technological innovations, together with the proliferation of end-product markets, are driving explosive bit growth and production volume increases, and reinforcing a trend towards longer device test times. With device speeds expected to increase further, NAND manufacturers require a test system that lowers test costs while offering an operating frequency range that can support high-speed interfaces.

Thus there exists a need for next-generation NAND flash memory test solutions that can scale to meet the coming demands of high-speed testing. There exists a need for technology that delivers unprecedented test time and test cost reductions.

SUMMARY OF THE INVENTION

In one embodiment, the present invention is implemented as a method for implementing efficient interrupt routing in a testing device. The method includes receiving an interrupt from a plurality of interrupt causes, consulting an interrupt routing table to determine an output interrupt vector, and forwarding the output interrupt vector to one or more of a plurality of different CPUs in accordance with the interrupt routing table.

In one embodiment, the testing device comprises a plurality of pin electronics modules.

In one embodiment, the testing device comprises a plurality of pin electronics modules and each of the pin electronics modules includes a plurality of bridge components and a plurality of CPUs.

In one embodiment, the testing device comprises a plurality of pin electronics modules coupled together via a high-speed bus.

In one embodiment, the testing device comprises a plurality of pin electronics modules having a plurality of bridge components, wherein each bridge component comprises two half bridge components.

In one embodiment, the testing device comprises a plurality of pin electronics modules, and wherein each of the pin electronics modules is configured to couple to a plurality of devices under test.

In one embodiment, the testing device comprises a plurality of pin electronics modules, and wherein the pin electronics modules can be configured to support different combined resource modes of operation.

In one embodiment, the testing device comprises a plurality of pin electronics modules, and wherein the pin electronics modules can be configured to support different combined resource modes of operation including the use of a plurality of CPUs and a plurality of bridge components.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE INVENTION

Figure 1:
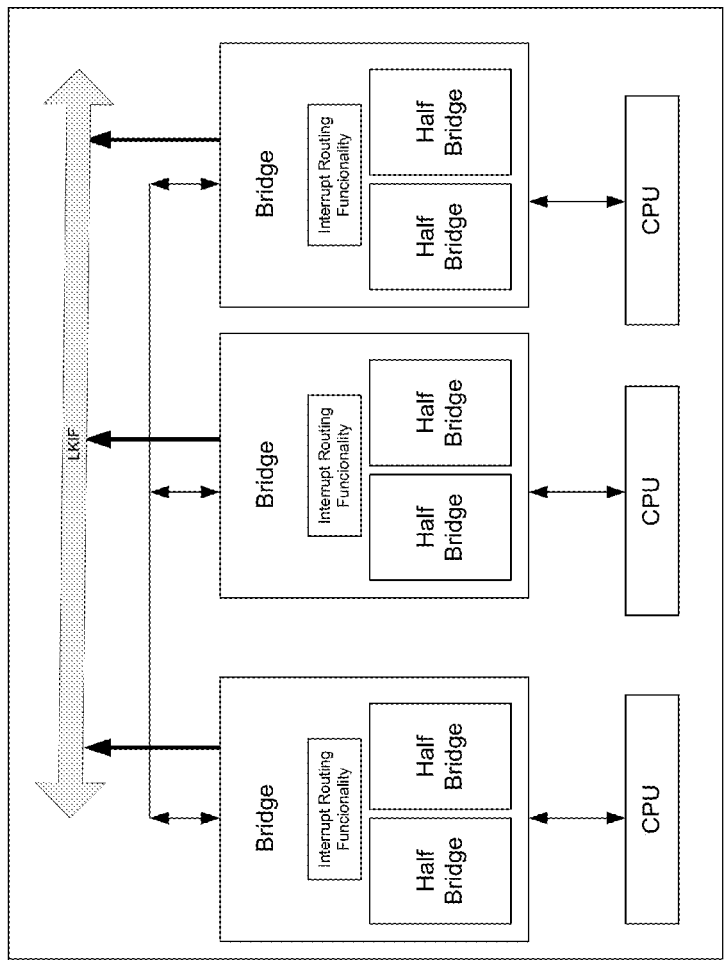
FIG. 1 shows a PEM communication bus structure in accordance with one embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system (e.g., computer system 500 of FIG. 5), or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Invention:

Embodiments of the present invention implement an efficient structure for sharing information regarding interrupts and handling of interrupts among a plurality of CPUs. Embodiments of the present invention implement a large-scale testing functionality (e.g., where many devices are under test simultaneously) using a plurality of CPUs and a corresponding plurality of bridge components to allow the CPUs to function cooperatively and in parallel. Embodiments of the present invention implement an efficient interrupt structure that allows the plurality of CPUs to cooperatively service interrupts from many different sources.

FIG. 1 shows a PEM communication bus structure in accordance with one embodiment of the present invention. As depicted in FIG. 1, the pin electronics module (e.g., PEM) includes three bridge components coupled to three corresponding CPUs. The communication between the CPUs and the bridges can be implemented using standardized serial communications (e.g., PCI express, etc.). Each bridge includes two half bridges as shown. Each bridge is coupled to communicate with each other bridge on the pin electronics module, as shown. Each bridge is also coupled to communicate with a high-speed interconnect. In this implementation, a Link Bus 2 interface (LKIF) is shown. The Link Bus 2 interface is used to enable communication between bridges mounted on the other pin electronics modules.

The FIG. 1 embodiment shows an interrupt routing functionality component within each bridge. These components implement an efficient interrupt structure that allows the plurality of CPUs to cooperatively service interrupts from many different sources. Although they are shown here as being implemented within the bridges, embodiments are possible where the interrupt routing functionality component resides within each half bridge.

The FIG. 1 embodiment also shows a legend detailing the different combined resource modes (CRM) that can be implemented by the pin electronics module. Combined resource modes allow the pin electronics module to dedicate more resources to solve different tasks. The amount of resources that can be dedicated can be varied in accordance with the difficulty of a given task. For example, CRM1 is a configuration of one half bridge sharing a single CPU, while CRM12 is a configuration of 12 half bridges with the master CPU and five slave CPUs.

Figure 2:
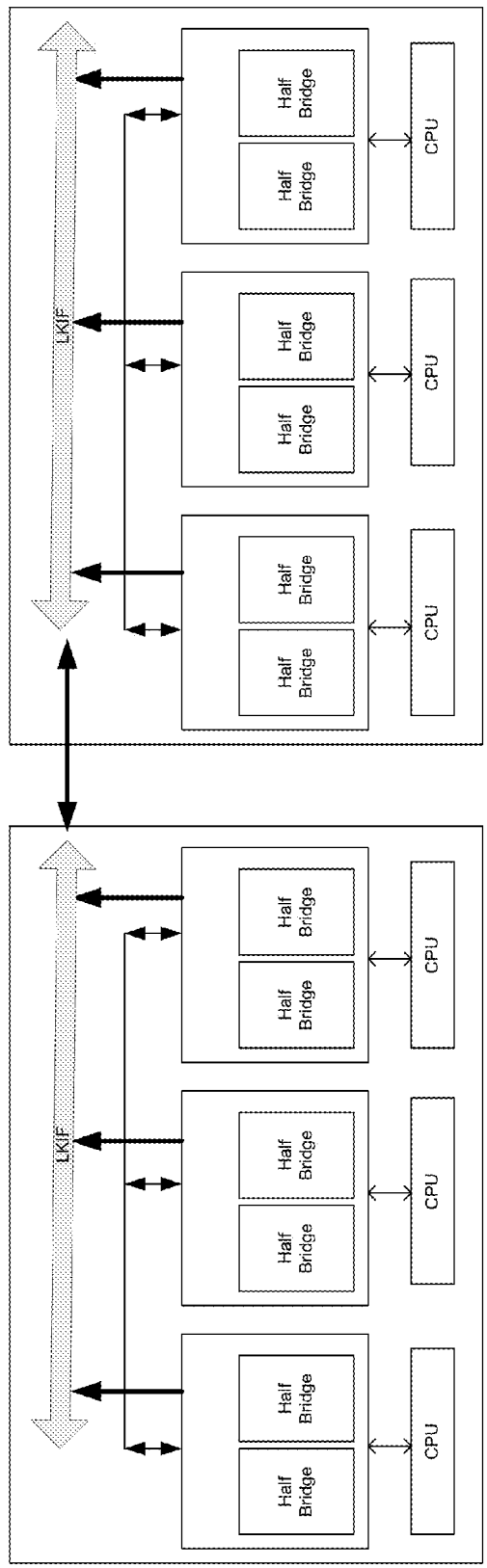
FIG. 2 shows a PEM communication bus structure implementing communication between two different pin electronics modules in accordance with one embodiment of the present invention.

FIG. 2 shows a PEM communication bus structure implementing communication between two different pin electronics modules in accordance with one embodiment of the present invention. In this manner, FIG. 2 shows how a large number of pin electronics modules can be linked together via the Link Bus 2 interface.

In this manner, embodiments of the present invention support flexible "CRM" modes, which allow for tester resources, and thus interrupt causes, to be generated by hardware under the control of both a local (slave) CPU and a, possibly different, remote master CPU. Many of possible causes can be efficiently separated and handled by appropriate software by using separate vectors.

Embodiments of the present invention flexibly route interrupt causes to programmable vectors on any combination (or none) of the master and slave CPUs. It should be noted that the CPUs are presumed to be connected to the interrupt generation mechanism by some form of communication bus, which is not explicitly shown in the figures.

Figure 3:
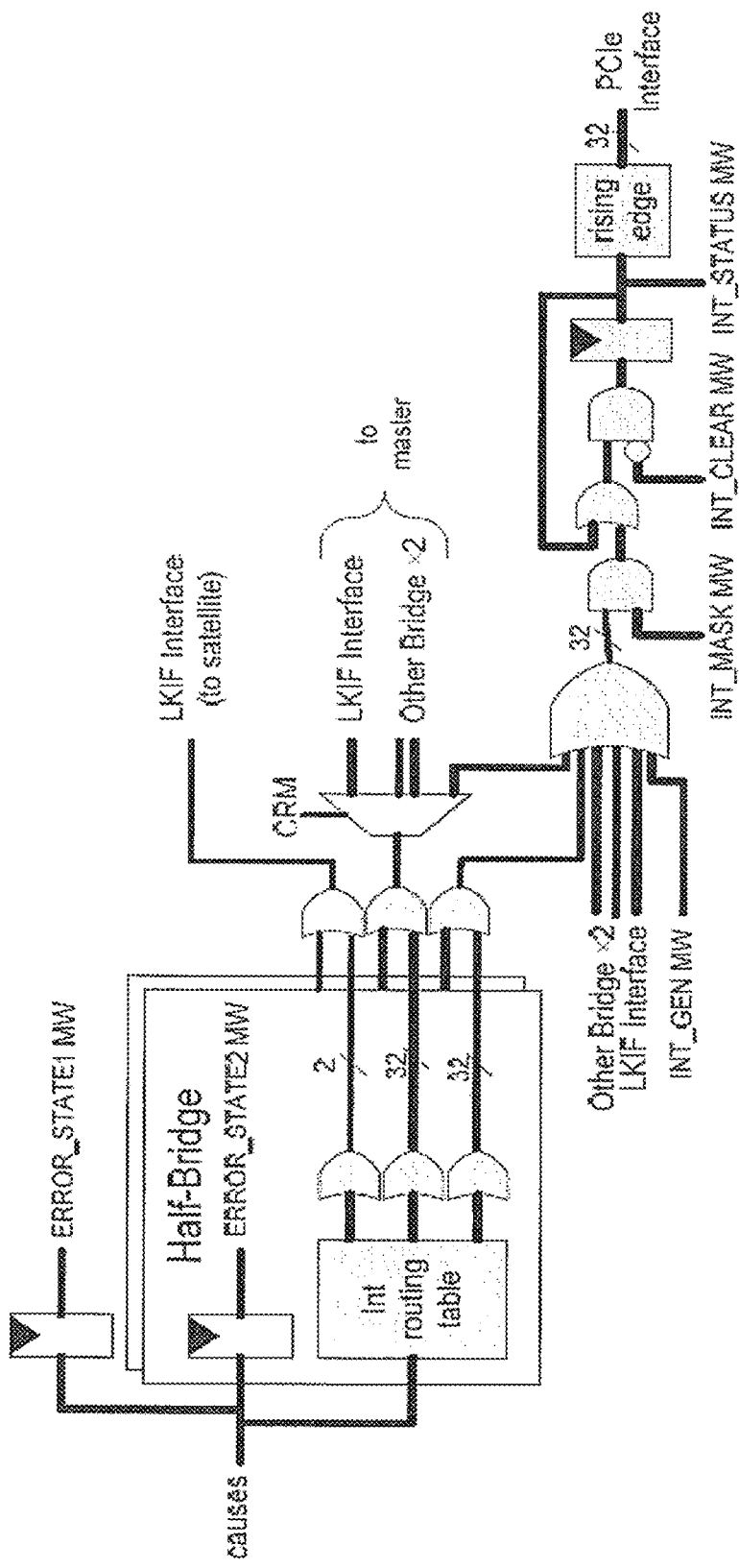
FIG. 3 shows an exemplary implementation of interrupt routing functionality in accordance with one embodiment of the present invention.

FIG. 3 shows an exemplary implementation of interrupt routing functionality in accordance with one embodiment of the present invention. FIG. 3 depicts causes of the interrupts coming into the left-hand side of a half bridge and been dispatched out of the right-hand side of the half bridge in accordance with a programmable interrupt routing table. As shown, the causes can be routed to other pin electronics modules via a Link Bus 2 interface, and depending on which particular combined resource mode is in operation, multiplexed to a Link Bus 2 interface or other bridges.

FIG. 3 also shows how interrupts from the various sources can be routed to the local test site controller, to a master test site controller (e.g., via serial, LKIF and CRM busses) and/or to a satellite board via LKIF and Link Bus 2.

In one embodiment, for CRM3, interrupts may be sent by the second Bridge to both the first and third test site controllers. This may be needed for alarm conditions which are common to both halves.

In this manner, the routing is completely flexible: each source may be ignored or routed to any combination of destinations. In one embodiment, each test site controller has a 32-bit cause vector. The satellite has just two bits (INT_AND, INT_OR). Any source, or combination of sources, may be routed to a given bit in the vector. In one embodiment, the bit routing is independent for each vector. For an interrupt to be generated, both the cause must be enabled and the corresponding vector bit unmasked.

In one embodiment, the FIG. 3 block is implemented fully in logic. There are no RAMs.

Figure 4:
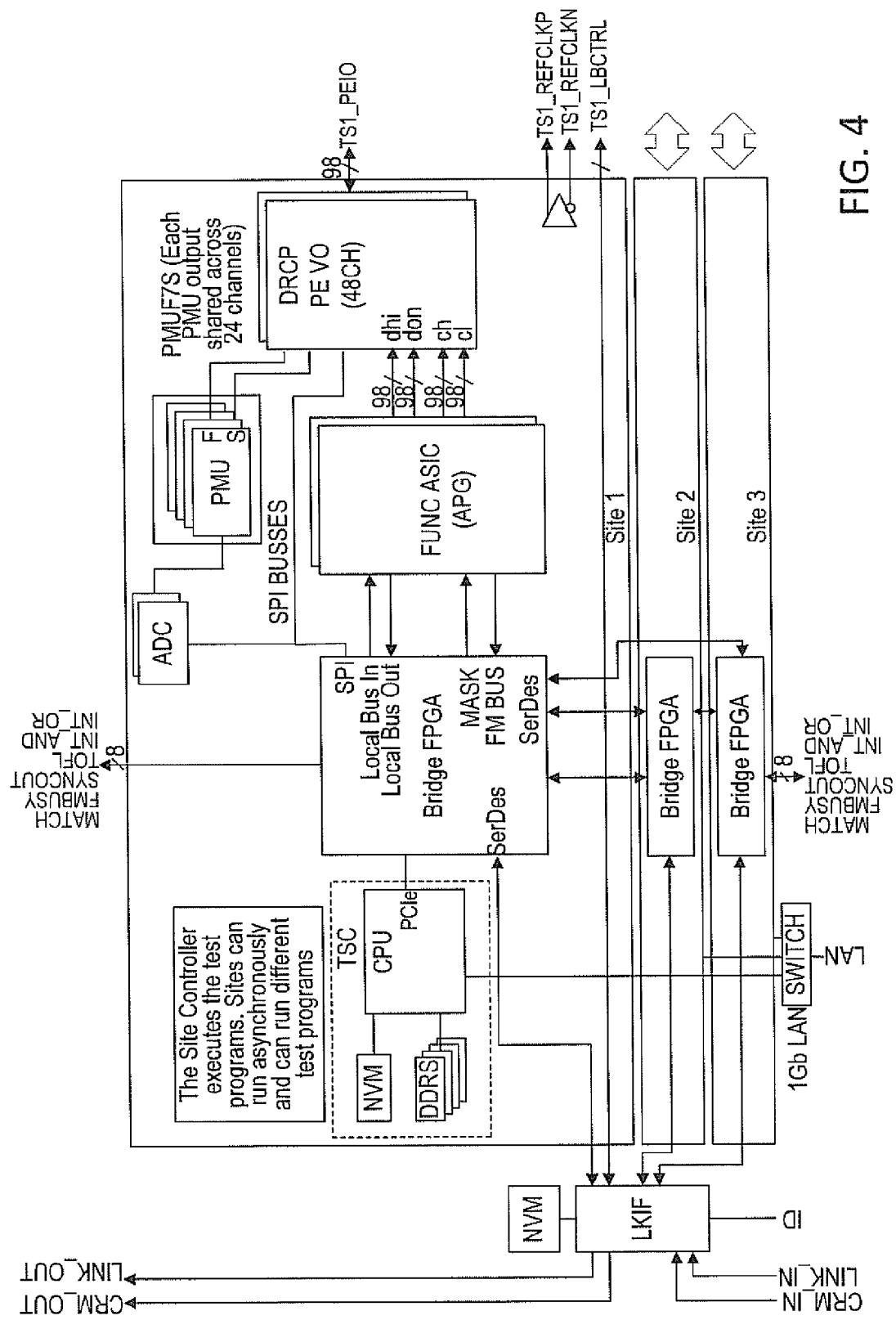
FIG. 4 shows an overview diagram of an exemplary FPGA-based pin electronics module in accordance with one embodiment of the present invention.

FIG. 4 shows an overview diagram of an exemplary FPGA-based pin electronics module in accordance with one embodiment of the present invention. FIG. 4 shows a test site controller coupled to a bridge FPGA. Pluralities of devices under test are coupled to receive the buses coming off of the right-hand side of the pin electronics module.

Figure 5:
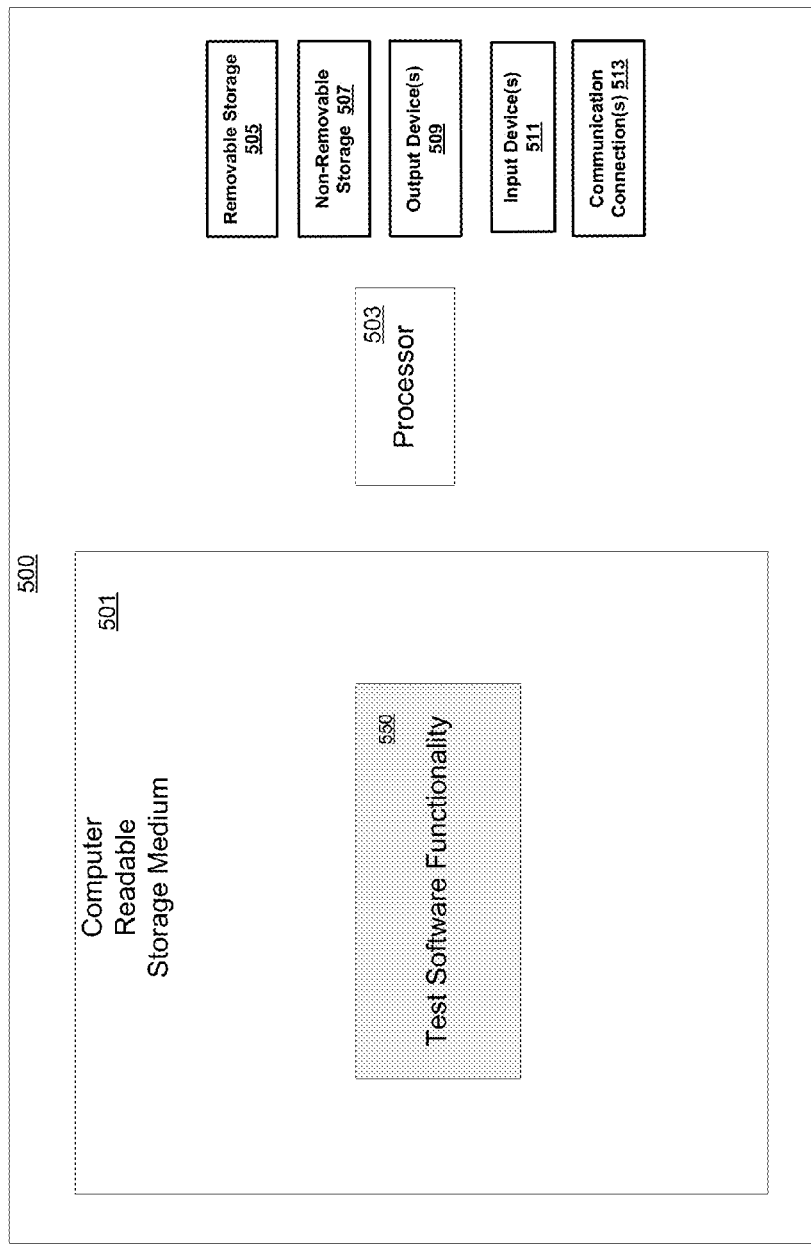
FIG. 5 shows an exemplary computer system according to one embodiment.

Computer System Platform:

FIG. 5 shows an exemplary computer system 500 according to one embodiment. Computer system 500 depicts the components of a basic computer system providing the execution environment for certain hardware-based and software-based functionality for the above described embodiments. Computer system 500 can be implemented as, for example, a server computer system, workstation computer system, desktop computer system, or laptop computer system. Similarly, computer system 500 can be implemented as a handheld device. Computer system 500 typically includes at least some form of computer readable media (e.g., computer readable storage medium 501). Computer readable media can be a number of different types of available media that can be accessed by computer system 500 and can include, but not limited to, computer storage media.

In its most basic configuration, computer system 500 typically includes processing unit 503 and a computer readable storage medium 501. Depending on the exact configuration and type of computer system 500 that is used, memory 501 can be volatile (e.g., such as DRAM, etc.) 501a, non-volatile 501b (e.g., such as ROM, flash memory, etc.) or some combination of the two. Similarly, the memory 501 can comprise other devices besides solid-state devices, such as, for example, magnetic disk-based media, optical media, or the like.

Additionally, computer system 500 can include other mass storage systems (e.g., removable 505 and/or non-removable 507) such as magnetic or optical disks or tape. Similarly, computer system 500 can include input devices 509 and/or output devices 511 (e.g., such as a display). Computer system 500 can further include network connections 513 to other devices, computers, networks, servers, etc. using either wired or wireless media. As all of these devices are well known in the art, they need not be discussed in detail.

It should further be noted, that the computer system 500 can have some, most, or all of its functionality supplanted by a distributed computer system having a large number of dispersed computing nodes, such as would be the case where the functionality of the computer system 500 is partly or wholly executed using a cloud computing environment.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. In a testing device, a method for implementing efficient interrupt routing, comprising:
   receiving an interrupt from a plurality of interrupt causes; and
   consulting an interrupt routing table to determine an output interrupt vector;
   forwarding the output interrupt vector to one or more of a plurality of different CPUs in accordance with the interrupt routing table.

2. The method of claim 1, wherein the testing device comprises a plurality of pin electronics modules.

3. The method of claim 1, wherein the testing device comprises a plurality of pin electronics modules and each of the pin electronics modules includes a plurality of bridge components and a plurality of CPUs.

4. The method of claim 1, wherein the testing device comprises a plurality of pin electronics modules coupled together via a high-speed bus, wherein said high-speed bus supports data transfers of at least 400 million bits per second.

5. The method of claim 1, wherein the testing device comprises a plurality of pin electronics modules having a plurality of bridge components, wherein each bridge component comprises two half bridge components.

6. The method of claim 1, wherein the testing device comprises a plurality of pin electronics modules, and wherein each of the pin electronics modules is configured to couple to a plurality of devices under test.

7. The method of claim 1, wherein the testing device comprises a plurality of pin electronics modules, and wherein the pin electronics modules can be configured to support different combined resource modes of operation.

8. The method of claim 1, wherein the testing device comprises a plurality of pin electronics modules, and wherein the pin electronics modules can be configured to support different combined resource modes of operation including the use of a plurality of CPUs and a plurality of bridge components.

9. A non-transitory computer readable memory having computer readable code which when executed by a computer system causes the computer system to implement a method for implementing efficient interrupt routing, comprising:
   receiving an interrupt from a plurality of interrupt causes;
   consulting an interrupt routing table to determine an output interrupt vector; and
   forwarding the output interrupt vector to one or more of a plurality of different CPUs in accordance with the interrupt routing table.

10. The computer readable memory of claim 9, wherein the computer system comprises a plurality of pin electronics modules.

11. The computer readable memory of claim 9, wherein the computer system comprises a plurality of pin electronics modules and each of the pin electronics modules includes a plurality of bridge components and a plurality of CPUs.

12. The computer readable memory of claim 9, wherein the computer system comprises a plurality of pin electronics modules coupled together via a Link Bus 2 interface.

13. The computer readable memory of claim 9, wherein the computer system comprises a plurality of pin electronics modules having a plurality of bridge components, wherein each bridge component comprises two half bridge components.

14. The computer readable memory of claim 9, wherein the computer system comprises a plurality of pin electronics modules, and wherein each of the pin electronics modules is configured to couple to a plurality of devices under test.

15. The computer readable memory of claim 9, wherein the computer system comprises a plurality of pin electronics modules, and wherein the pin electronics modules can be configured to support different combined resource modes of operation.

16. In a testing device, a method for implementing efficient interrupt routing, comprising:
   receiving an interrupt from a plurality of interrupt causes; and
   consulting an interrupt routing table to determine an output interrupt vector;
   forwarding the output interrupt vector to one or more of a plurality of different CPUs in accordance with the interrupt routing table,
   wherein the testing device comprises a plurality of pin electronics modules and each of the pin electronics modules includes a plurality of bridge components and a plurality of CPUs.

17. The method of claim 16, wherein the testing device pin electronics modules are coupled together via a high-speed bus, wherein said high-speed bus supports data transfers of at least 400 million bits per second.

18. The method of claim 16, wherein the testing device comprises a plurality of pin electronics modules having a plurality of bridge components, wherein each bridge component comprises two half bridge components.

19. The method of claim 16, wherein each of the pin electronics modules is configured to couple to a plurality of devices under test.

20. The method of claim 16, wherein the pin electronics modules can be configured to support different combined resource modes of operation.

* * * * *